US006446158B1

United States Patent
Karabatsos (10) Patent No.: US 6,446,158 B1
(45) Date of Patent: Sep. 3, 2002

(54) MEMORY SYSTEM USING FET SWITCHES TO SELECT MEMORY BANKS

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 0 days.

(21) Appl. No.: 09/572,641

(22) Filed: May 17, 2000

Related U.S. Application Data (60) Provisional application No. 60/141,219, filed on Jun. 29, 1999, and provisional application No. 60/134,511, filed on May 17, 1999.

(51) Int. Cl.$^7$ .............................................. G06F 12/00
(52) U.S. Cl. .......................... 711/5; 711/167; 711/157; 365/230.03; 365/230.04; 365/233; 365/194
(58) Field of Search ........................... 711/5, 157, 167; 365/230.03, 230.04, 233, 194

(56) References Cited

U.S. PATENT DOCUMENTS

| | | | | |
|---|---|---|---|---|
| 5,261,068 A | * | 11/1993 | Gaskins et al. | 711/157 |
| 5,666,322 A | * | 9/1997 | Conkle | 365/233 |
| 5,950,223 A | * | 9/1999 | Chiang et al. | 711/105 |
| 6,163,491 A | * | 12/2000 | Iwamoto et al. | 365/201 |
| 6,233,650 B1 | * | 5/2001 | Johnson et al. | 711/5 |

OTHER PUBLICATIONS

Cosoroaba, Adrian B., "Double Data Rate Synchronous DRAMs in High Performance Applications", Conference Proceedings Wescon/97, Nov. 4–6, 1997; pp. 387–391.*

Burns et al., "Principles of Electronic Circuits", West Publishing Company, 1987, p. 151.*

* cited by examiner

Primary Examiner—Reginald G. Bragdon
(74) Attorney, Agent, or Firm—Mark P. White

(57) ABSTRACT

A computer memory system provides a double data rate (DDR) memory output while requiring memory chips with only half the frequency limit of the prior art DDR memory chips. The system contains a first memory bank having data lines and a second memory bank having data lines. The first and second memory banks are associated with first and second clock signals, respectively, where the second clock signal is delayed from the first clock signal such that the data lines of the first memory bank are connected to a data bus in synchronism with the first clock signal while the data lines of the second memory bank are connected with the data bus in synchronism with the second clock signal. In one embodiment, a first FET switch connects the data lines of the first memory bank with the data bus and a second FET switch connects the data lines of the second memory bank with the data bus. The second FET switch is connected to the data bus at a time delayed from the beginning after the start of each clock cycle of the second clock signal. As a result, the data bus is never connected to the data lines of both memory banks at the same time, but rather, the data bus is alternately connected with the first memory bank and then the second memory bank.

13 Claims, 9 Drawing Sheets

FIG. 5A  100 MHz

FIG. 5B  A  1  0  DOUBLE BUS RATE

FIG. 5C  B  1  0  Z  DOUBLE BUS RATE MODIFIED

FIG. 5D  C  Z  1  0  DOUBLE BUS RATE MODIFIED
Z=HIGH IMPEDANCE

FIG. 5E  D  1  0  1  0  DATA BITS AT THE COMMON
PIN D OF
t1  t12  t2  t3

MEMORY SYSTEM USING FET SWITCHES TO SELECT MEMORY BANKS

This application claims priority based on the filing of provisional applications filed on Jun. 29, 1999, application Ser. No. 60/141,219 and on May 17, 1999, application Ser. No. 60/134,511.

FIELD OF THE INVENTION

The present invention relates to providing increased data access speed in computer memories without increasing the basic clock rate of the memory.

DESCRIPTION RELATIVE TO THE PRIOR ART

Terminology

Throughout this description the following terms are used:

DIMM=Dual In line Memory Module

SDRAM=Synchronous Dynamic Random Access Memory.

DDR=Double Data Rate. Data bit duration equals one half the period of the clock frequency. Two bits of data are used in one period of the base clock. See FIG. 1(b).

DBR=Double Bus Rate.

SDR=Single Data Rate.

DBF=Data Bit Frequency. The number of bits per second per pin. Referred to as xx bit/sec/pin.

DR =Data Rate. The Data Bit duration equal to one period of the base clock. See FIG. 1(a)

Definition: Double Bus Rate (DBR)

For the purpose of description through out this document, the term DBRTM (Double Bus Rate) will be used. Double Bus Rate means that the Data Rate. out of and into a BUS system will be double of what each individual chip connected to the BUS delivers at its operating clock frequency.

PRIOR ART

Figure 1A:
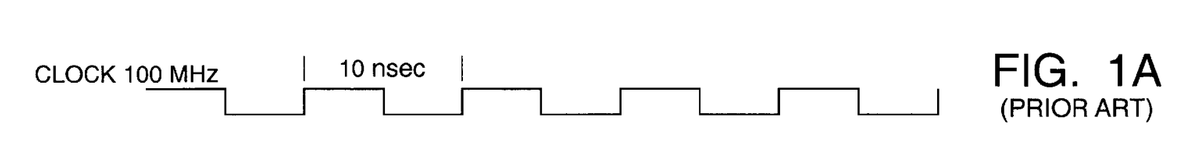
FIG. 1(A) depicts a system clock waveform of the prior art.

The desire for increased throughput in a memory subsystem requires that the memory devices perform at higher speeds. Normally, a memory chip of the single data rate type SDR operating at a certain base frequency will produce data rate DR of one period of the base frequency. A DR of 100 MHz means that the duration of each data bit will be equal to one period of the 100 MHz frequency which is equal to 10 nanoseconds. The data bit pulse- width coming out of the DRAM chip will be one period of the base clock. Therefore, as shown in FIG. 1(a), the actual frequency of any data bit alternating between 1 and 0 when the base clock is 100 MHz is 50 MHz.

As it pertains to the memory chip packaging configuration used today, in order to meet a desired DATA BUS width, a cluster of memory chips, such as SDRAMs, are assembled together on a printed circuit board. (The smallest bus-width is the actual number of bits coming out of a single SDRAM chip in a cluster of one). These boards are configured in several forms, known as SIMMs, DIMMs, SODIMMs, RIMMs, etc. However, for the sake of brevity, the term DIMM will be used hereinafter to refer to any or all of these different types.

The prior art DIMM module of 168 pins, (the design applies to any D o of any other pin count, or any other package known by any other name), currently uses (as defied by the JEDEC—Joint Electron Device Engineering Counsel—Committee) 72 Data bits bus, Control lines, Address lines, Power and Clocks. The present modules as defied by the JEDEC standard can accommodate up to two Banks or Rows of SDRAM chips. Other configurations of banks are also used depending on the system architecture.

The selection of the Banks is controlled by a single Chip Select (CS) line or a combination of the Chip Selects and other control lines. The DIMM module is either a Register or NonRegister configuration. In a Register configuration all the Address and Control lines are latched into a Register first before they are presented to the devices to be selected for operation In a Non-Register configuration the Address and Control lines are wired directly from the input tabs of the DIMM to the devices. Either configuration can have a Phase Locked Loop (PLL) for clock synchronization or utilize the clock presented to the DIMM by the system. As shown in FIG. 1(a), with a clock of 100 Mplz for the base operating frequency of the memory chip, the module can only produce a maximum DR of 100 MHz. If the clock frequency is raised to 133 MHz, and the SDRAM devices on the DJMM operate at 133 MHz, the maximum DR is increased to 133 MHz. In order to achieve 200 MHz DF, the SDRAM chips must operate at the base frequency of 200 MHz. To have SDRAM chips operate at higher frequencies requires development dollars, time and improvements in silicon speed and processing. Density and speed interfere with each other, When the density increases, the speed decreases simply because many levels of interconnection are required for the circuitry and thus more delay is introduced to the circuit path. Also the implementation of high speed and high density within the silicon becomes very difficult, and in some cases, prohibitive.

In prior art designs of the DIMM utilizing SDRAM devices operating at 100 MHz clock rates, the design is easily implemented with the commonly used Printed Circuit Board (PCB) physical properties and line widths. Therefore, designing a DIMM memory module with base clock frequency of 100 MHz is quite simple to produce with the current technology. The problem appears when one is trying to produce devices that operate at 200 MHz base clock frequency.

Figure 2A:
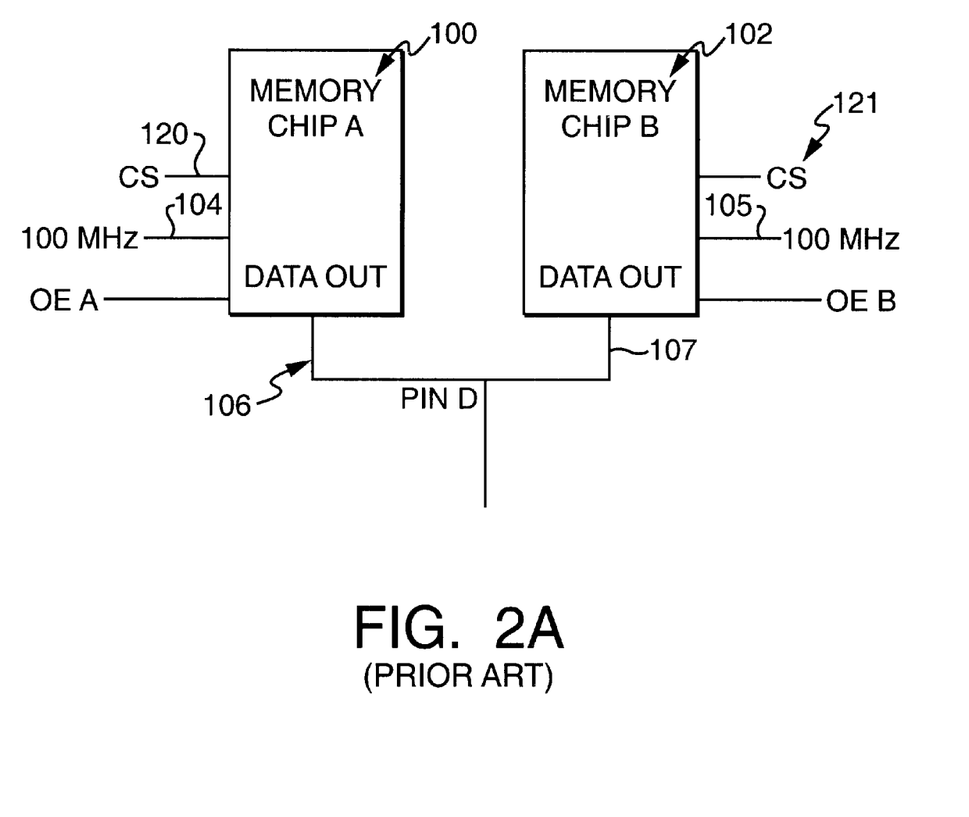
FIG. 2(a) depicts a prior art DDR system.

Referring now to FIG. 2A, it is seen that, in the prior art, two identical memory chips 100, 102, are controlled by the same 100 MHz clock at clock input A 104, and clock input B 105. The single bit output 106 of chip A is connected to the corresponding output 107 of chip B. Only one chip is allowed to operate at any given time with the other chip isolated to high impedance by internal chip circuitry at the outputs 106, 107. The Chip Select (CS) input of Chip A 120 allows Chip A to access the data, and the corresponding input 121 does the same for chip B. This architecture is the basis for building DIMM modules with prior art.

Figures 2B, 2C:
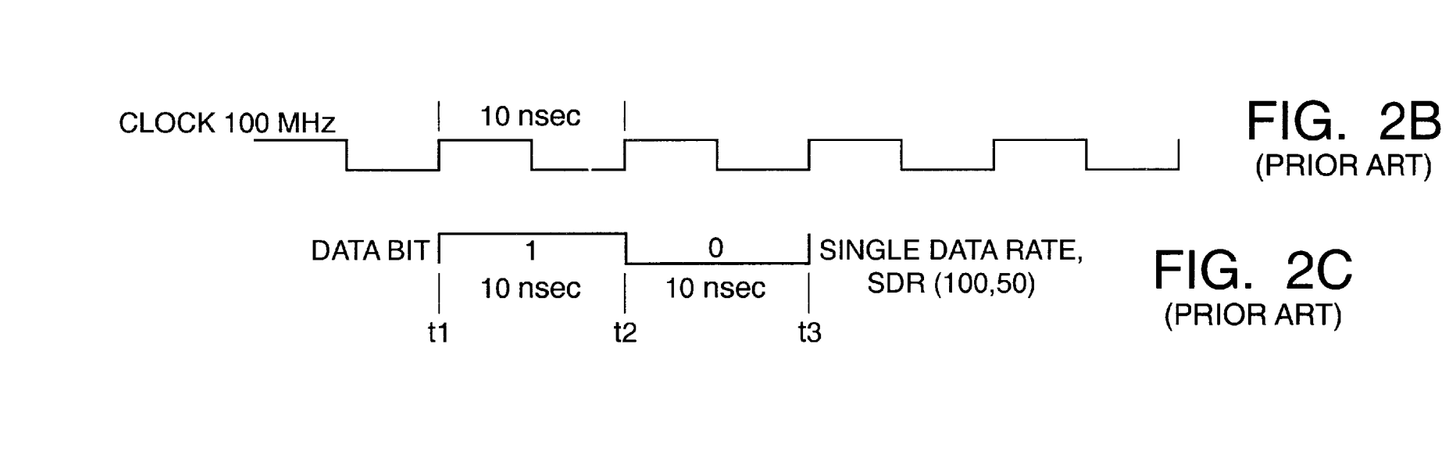
FIG. 2(b) depicts a typical system clock used in the SDR memory system of the prior art.
FIG. 2(c) depicts the SDR output onto the data bus of the prior art.

Both of the chips above are operating from the same clock. The data bit at pin D 102, 106 will either come from chip A or chip B. Referring now to FIG. 2(b), the clock which appears at the input pin of chip A 104 and chip B 105 has a 100 MHZ frequency. A typical clock cycle begins at t1 with an positive-going signal, and ends at t2, 10 nanoseconds later. A typical data signal, shown as FIG. 2(c), is synchronized with the data signal, so that a data "one" condition begins at t1, and ends at t2, while the following data "zero" begins at t2 and ends at t3. It should be noted that the highest bandwidth data signal which be processed by this system is one with alternating ones and zeros. Still referring to FIG. 2(c), it is seen that such a data signal has a frequency of one-half the clock frequency, although the data rate, measured in bits per second, is the same as the clock rate As a result, the highest data rate DR delivered to a memory bus of the prior art system is equal to the data rate that the memory chips A or chips B can deliver by design.

The JEDBC group has developed an architecture wherein one bit of data has duration of validity equal to one half the period of the base clock frequency. This scheme is called DDR for (Double Data Rate). A DIMM designed with such SDRAM devices is called DDR DIMM. Although such DDR memories are currently in existence, they require memory chips operating at twice the clock frequency. Such high speed memory chips are expensive and difficult to produce.

Figure 1B:
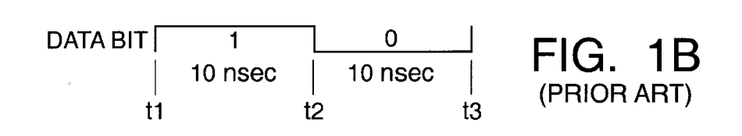
FIG. 1(b) depicts a typical SDR data stream of the prior art.
Figure 1C:
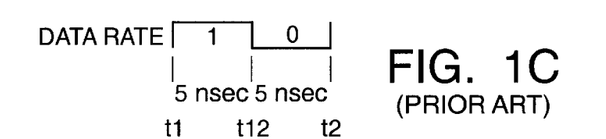
FIG. 1(c) depicts a typical DDR data strewn of the prior art.

Referring now to FIGS. 1(a) through 1(c), the rates of the various signals described herein are shown. Referring now to the first such waveform, a 100 MHz clock is shown FIG. 1(a), together with a typical data bus signal (a single bit only is shown for illustrative purposes) of the prior art DIMM, in FIG. 1(b). Each data bit begins in synchronism with a positive-going edge t1 of the clock signal. This waveform is typical of the SDR configuration of the prior art.

In comparison, the DDR data bus of the prior art operates at twice the SDR rate. Referring now to FIG. 1(c), each data bit of the DDR data signal begins with either the positive-going edge t1 of the clock signal, or the negative-going edge t12 of the clock signal.

Presently, the devices used incorporate a 100 MHz base clock frequency, and a 100 MHz Data Bit Frequency of the DUR type. For the purposes of this description these devices will be called SDRAM DDR devices (100,100). The current invention will disclose a system which produces 400 MHz DR and 200 MHz Data Bit Frequency utilizing SDRAM chips (100,100). This system is called the Double Data Rate/Double Bus Rate (DDR/DBR) system.

Using the technique of the current invention described herein, a DR of 400 MHz, or 200 MHz DBF is produced at the data bus using a 100 MHZ clock frequency. Using the prior art, in comparison, the fastest speed achievable with existing SDRAM devices is the speed of the SDRAM device itself. By using the techniques described herein, however, existing SDRAM devices, whether SDR or DDR, will produce double the device's DR on the data bus. See FIGS. 1(c)–(f)

SUMMARY OF THE INVENTION

It is the general object of the current invention to provide a DDR memory architecture using SDR memory chips. It is a further object of this invention to combine DDR memory chips to provide a quad-speed output.

In accordance with one aspect of the current invention, a computer memory system with a data bus includes a first bank memory bank with data lines; a second memory bank having data lines; and a clock signal having a multiplicity of cycles, each having a start, and a period p; In addition, the system includes a first switching means to connect the data lines of the first memory bank with the data bus beginning at the start of each cycle, and lasting for a time p/2, and a second switching means to connect the data lines of the second memory bank with the data bus beginning at p/2 after the start of each cycle, and lasting for a time p/2 thereafter.

In accordance with a second aspect of the invention, the computer memory system also includes a delayed clock signal at a phase 180 degrees relative to the clock signal, with the second switching means synchronized with the delayed clock signal.

According to a third aspect of the invention, the system includes a motherboard, and the means to generate the delayed clock signal, the first memory bank, the second memory bank, the first switching means, and the second switching means are all located on the mother board.

According to a fourth aspect of the invention, the system includes one or more DIMM boards, and the means to generate the delayed clock signal, the first memory bank, the second memory bank, the first switching means, and the second switching means are located on the DIMM boards.

According to a fifth aspect of the invention, the first switching means includes first FET switch, the second switching means includes a second FET switch.

According to a sixth aspect of the invention, the first FET switch includes a control input, a first side connected with the data bus, and a second side connected to the data lines of the first memory bank. In addition, the second FET switch further includes a control input, with a first side connected with the data bus, and a second side connected to the data lines of the second memory bank.

According to a seventh aspect of the invention, the first switching means includes a first data enable signal operating on a first memory chip, and the second switching means includes a second data enable signal operating on a second memory chip.

According to an eighth aspect of the invention, the system also includes a circuit having an input and an output, with the input connected to the clock signal, and the delayed clock signal the output, selected from the group which consists of wire length delay circuits, skewed output driver delay circuits, cascaded PLLs delay circuits, skewed output PLL delay circuits, external to PLL delay circuits, passive element delay circuits, and programmed delay lines.

According to a ninth aspect of the invention, a computer memory system having a data bus, includes a first bank memory bank having data lines, a second memory bank having data lines, and a clock signal having a multiplicity of cycles, each having a start, and a period p. It also has a first switching means to connect the data lines of the first memory bank with the data bus beginning at the start of each cycle, and lasting for a time p/4, and starting again at p/2 after the start of each cycle, and lasting for a time p/4. It further has a second switching means to connect the data lines of the second memory bank with the data bus beginning at p/4 after the start of each cycle, and lasting for a time p/4, and starting again at 3p/4 after the start of each cycle, and lasting for a time p/4.

BRIEF DESCRIPTION OF THE DRAWINGS

These, and further features of the invention, may be better understood with reference to the accompanying specification and drawings depicting the preferred embodiment, in which.

DESCRIPTION OF THE PREFERRED EMBODIMENTS

In the following discussion, the operation of a single bit of memory is shown, with the understanding that a typical computer memory may have 64 or 72 bits. The operation of the single bit may be extrapolated to include the 64 or 72 bits which make up a single memory read or write. In reality, a single memory chip will have 8 bits or more, and 8 or 9 memory chips will be required to form a single memory word. But for simplicity and clarity of the description following, a single chip, with a single bit output, will be used.

Figure 3A:
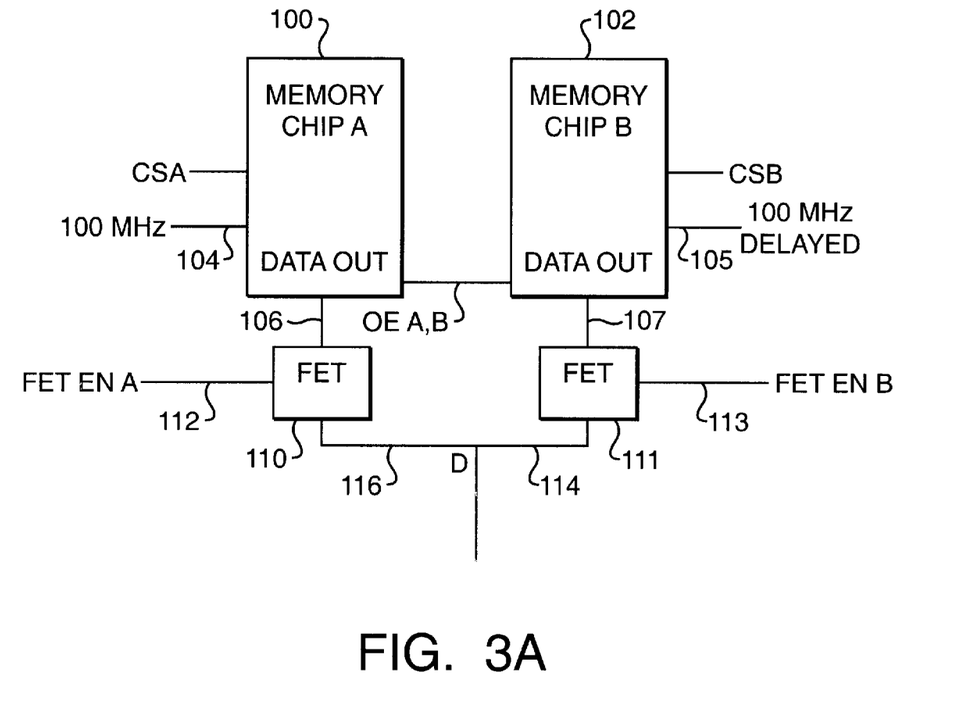
FIG. 3(a) depicts a circuit diagram of the preferred embodiment of the present invention.
Figures 3B, 3C:
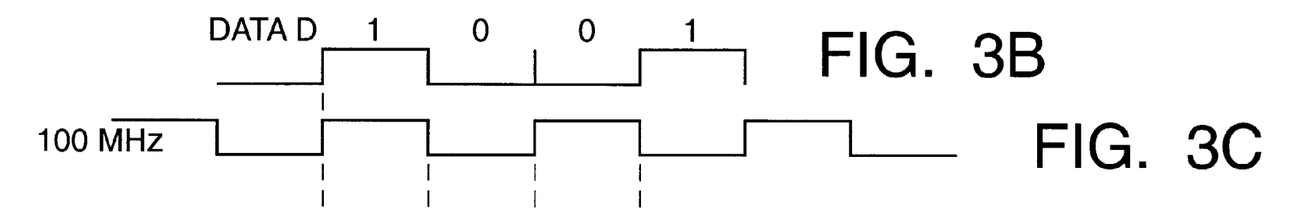
FIG. 3(b) depicts a DDR data stream of the preferred embodiment.
FIG. 3(c) depicts a system clock used in the preferred embodiment.

Referring now to FIG. 3(a), memory chips A 100 and B 102 are enabled and they are allowed to operate with their respective clocks, clock A 104, and clock B 105, both operating at 100 MHZ. Clock B in this example is shifted or delayed from the other by one half period, as seen in FIG. 3(c). At the output of each data bit a FET switch is inserted in series. FET switch A 110 corresponds to memory chip A, and FET switch B 111 corresponds to memory chip B. The output 106 of memory chip A is connected to the input of FET switch A 110. PET switch A is controlled by enable signal A 112. The output of memory chip B is similarly switched by FET switch B 113. The outputs of FET switch A 116 is connected to the output of FET switch B 114. In the preferred embodiment. the two outputs are connected to a tab of the DIMM, which tab can be part of a wider Data Bus.

Figure 3D:
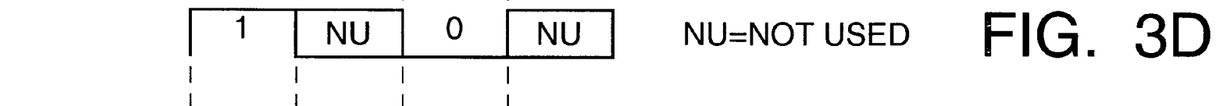
FIG. 3(d) depicts the output of memory bank A of the preferred embodiment.
Figure 3E:
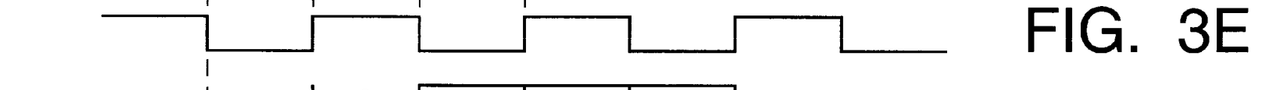
FIG. 3(e) shows the delayed clock used in the preferred embodiment.
Figure 3F:
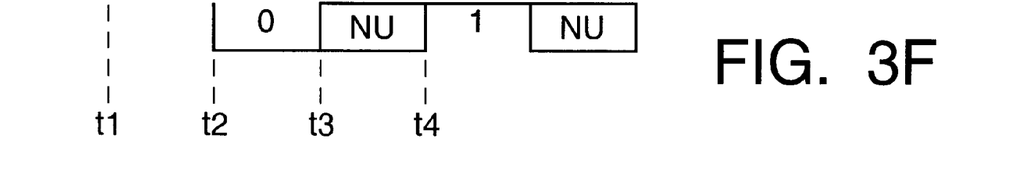
FIG. 3(f) depicts the output of memory bank B of the preferred embodiment.

When a FET switch is enabled, the data path through the switch presents vey negligible delay to the signal. When the switch is disabled, the data path is high impedance and no signal can travel through it In the following example, the data stream on the data bus is shown as FIG. 3(b). The clock, shown in FIG. 3(c), has a period p equal to t3–t1. Referring now to FIG. 3(d), which shows the output of FET switch A, it is seen that when FET switch A 110 is enabled at t1, and allowed to stay enabled for one half period, until t2, and then switched off until t3, the output of memory chip 1 will be connected to the data bus 114, 116 for only one-half period. FIG. 3(e) shows the delayed clock connected to memory chip B, and synchronized with the FET EN B signal 113 connected to FET switch B . Referring next to FIG. 3(f), which shows the output of FET switch B, when, at the next half period and beginning at t2, FET switch B is enabled, and allowed to remain enabled for one-half a period until t3, and then switched off for a half-period, the output of memory chip B will then be connected to the data bus 114, 116 for the other half-period. As the process continues, the data bus is connected alternately between memory chip A and memory chip B, resulting in two data bits on the data bus in each clock period p. The result is in accordance with the DDR standard, that is, the data rate on the bus is twice the data rate of the standard, SDR system.

Although there are prior art devices which produce DDR output, the current invention discloses a method whereby DDR operation is accomplished with single data rate memory chips. The individual memory chips continue to operate at SDR speed, with one data bit output every clock cycle. By reducing the duration of the memory chip data output to one-half the clock period, however, it becomes possible to use the other half period to output the data from a second memory chip. The FET switches, by reducing the sampling time to one-half the actual data time of the corresponding memory chip, in effect double the bandwidth of the memory chip itself.

SECOND PREFERRED EMBODIMENT

Figure 1D:
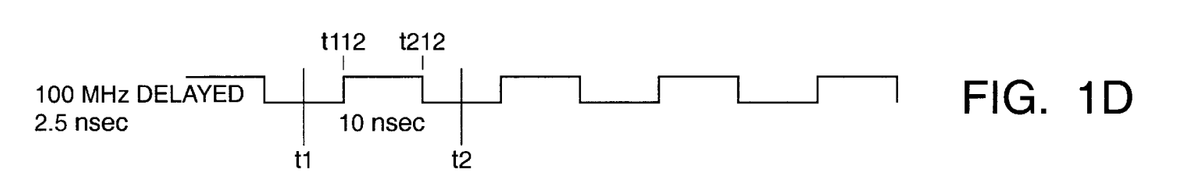
FIG. 1(d) depicts a delayed clock 90 degrees out of phase with the system clock.
Figure 1E:
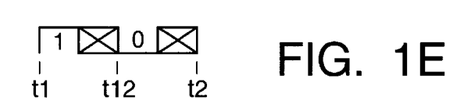
FIG. 1(e) depicts a typical quadruple data rate data stream output from one memory bank of the current invention.
Figure 1F:
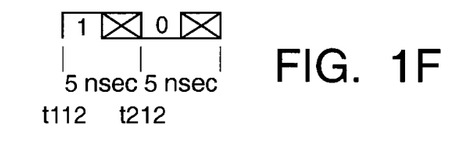
FIG. 1(f) depicts a typical quadruple data rate data stream output from the other memory bank of the current invention.

If memory chips A and B operate by design at DDR speed, each producing output data at a rate equal to the basic clock rate, then by applying a clock to chip B further by ¼ period and applying the FET switching which maintains the data to the data bus valid for one-quarter a clock period, four data bits are passed to the data bus within one period of the clock. The outputs of the FET switches in this embodiment are shown in FIGS. 1(e) and 1(f)

This embodiment may be understood by continuing to refer to FIG. 3(a) to illustrate the interconnection of the components in this invention. Referring now to FIG. 1(a), the system clock has a period peq to t2–t1 The 90 degree-phase-shifted clock applied to chip B is shown in FIG. 1(d). FIG. 1(e) depicts the data output onto the data bus 114, 116 by memory chip A. The output 106 of memory chip A is connected, through FET switch A, to the data bus for half the period t12–t1, while the output 107 of memory chip B is connected, through FET switch B, to the data bus start at time t112, and is valid for the same half-period as the output of memory chip A.

Each data bit valid duration is usefuil only for the required set-up and hold times of the device that receives the data. As the silicon technology speed increases, the set up and hold times required for the data bit to be valid is decreasing. Therefore, utilizing only a portion of the data bit valid duration does not affect the reliability of the operation, but allows the enhancing of the speed significantly.

The above example dealt only with two memory devices. Those devices can be mounted on a module or on a motherboard. Other devices besides memory chips may employ this invention in order to increase the data bus bandwidth without increasing the actual operating frequency of the device. If one uses several memory devices on a DIMM board, and the FET switch connections are implemented as in FIG. 3 for each data bit, then the whole bus width will perform at a wide bandwidth data rate.

The total arrangement that is used on a DIMM can also be implemented on a motherboard, rather than using DIMM boards. The combination of Control lines such as RAS (Row Address Select), CAS (Column Address Select), WE (Write Enable), and CS (Chip Select) are normally used for operation of devices such as memory chips. The signals on these Control lines are normally clocked into the device by the rising edge of the 100 MHz clock. According to the first preferred embodiment of this invention, the data at the output each device is referenced to the rising edge of the clock which controls that device.

If the Data bit from one SDRAM device is allowed to be valid on the Data Bus only for half of the 10 nanoseconds duration, as shown in FIG. 1(c), and the other half is used for valid Data from another SDRAM device, a 200 MHz Data Rate DR is produced. This is accomplished with ordinary SDRAM devices operating at 100 MHZ clock rates, and 100 MHZ data rates.

As an additional alternative method, a single FET is used to multiplex the output of two memory modules, rather than employing two FET switches. In such an arrangement, the FET switch has two inputs, each one connected to a separate memory chip output, and a single FET output connected to the data bus.

ALTERNATIVE EMBODIMENT WITHOUT FET SWITCHES

In another alternative embodiment, the switching of the memory chip outputs is done by the memory chips themselves, and without the use of FET switches.

Figure 4A:
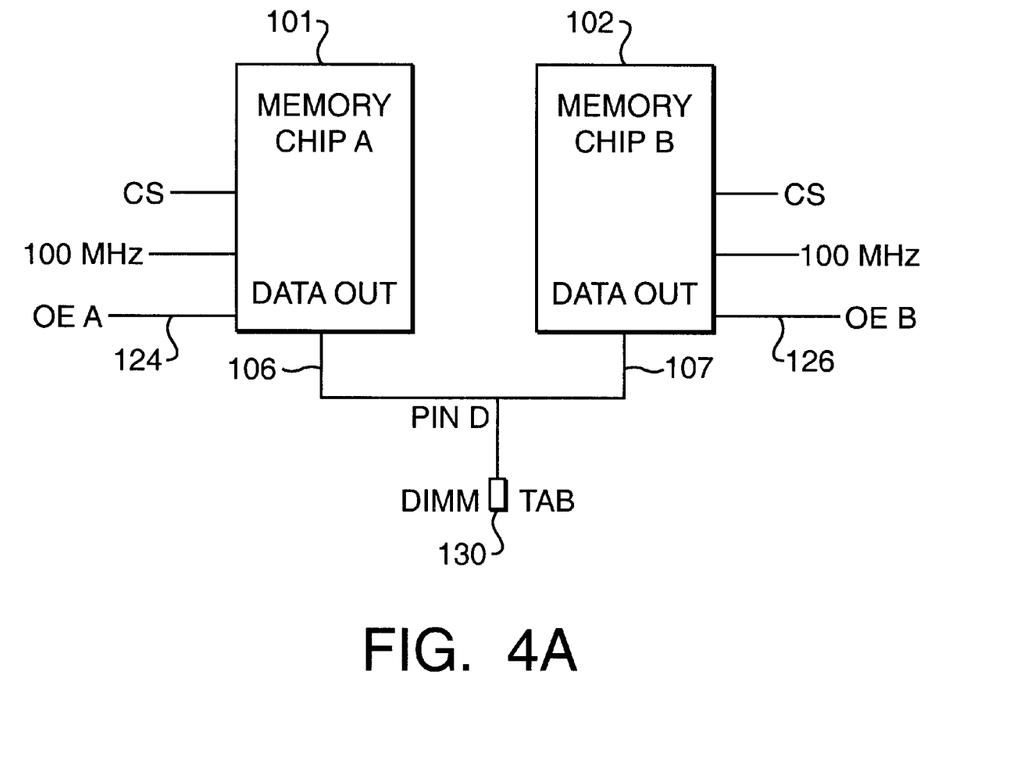
FIG. 4(a) depicts a circuit diagram of an alternate embodiment of the present invention.

In this embodiment the two SDRAM memory chips have their data output pins connected together to the DIMM board tab 130, as shown in FIG. 4(a). This connection can be either on a motherboard, or on a DIMM.

Figure 4B:
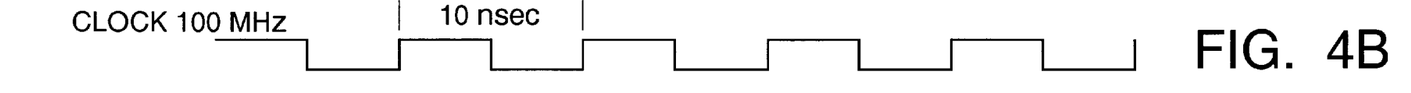
FIG. 4(b) depicts the system clock used in the alternative embodiment of the present invention.
Figures 4C, 4D, 4E:
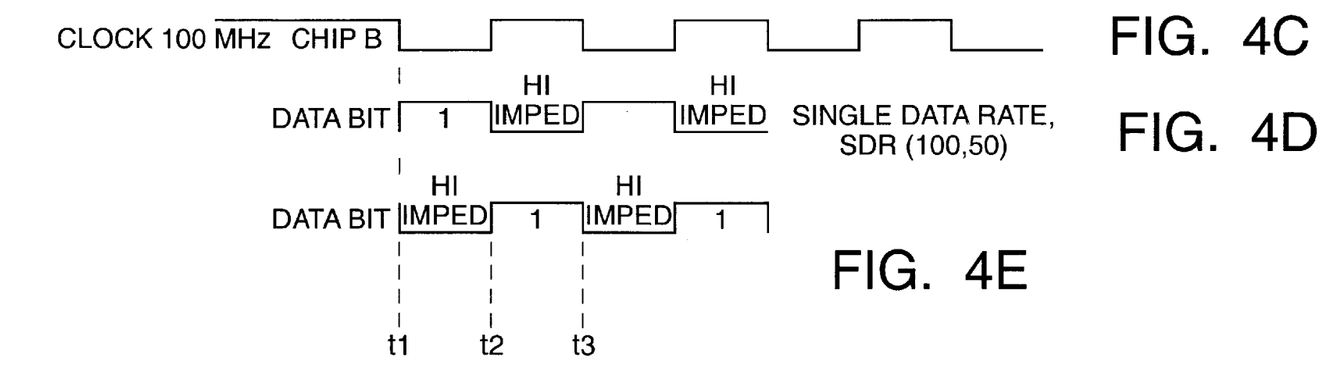
FIG. 4(c) depicts the delayed clock used in the alternative embodiment of the present invention.
FIG. 4(d) depicts the data stream output from bank A of the alternate embodiment.
FIG. 4(e) depicts the data stream output from bank B of the alternate embodiment.

Consider that Chip B 102 has its clock, shown in FIG. 4(c), shifted by one half period relative to the base clock shown in FIG. 4(b).

In this embodiment each SDRAM memory chip holds a data bit valid at the output pin 106, 107 when enabled by the corresponding output enable signals 124, 126, and revert to high impedance when not enabled. This type of device is referred to as a tri-state device, having an output which may be a logic one, a logic zero, and a high impedance state.

Referring now to FIG. 4(d), it is seen that the data bit, corresponding to memory chip A 101, is active during the first half of each period, between the times t1 and t2. Memory chip B 102, on the other hand, is active during the second half-period of each cycle, that is, between t2 and t3.

Alternatively, each memory chip could be controlled to be active either at the first half of the clock cycle, or the second half, in accordance to an additional control signal.

Figure 5A:
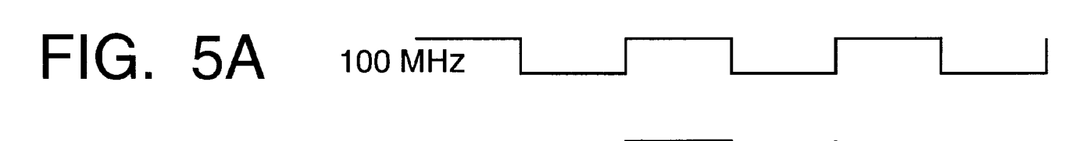
FIG. 5(a) depicts a system clock for reference in the modified DBR embodiment.
Figure 5B:
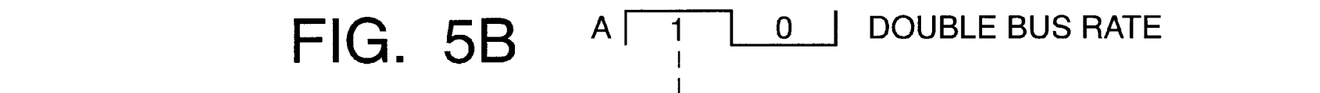
FIG. 5(b) depicts a DBR output.
Figure 5C:
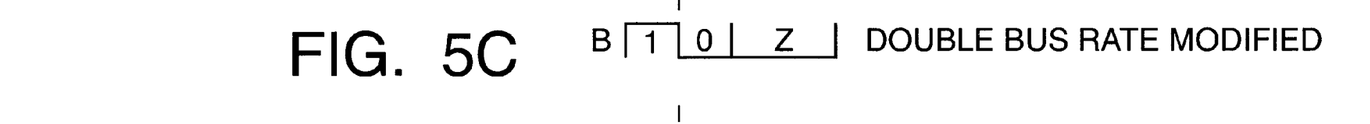
FIG. 5(c) depicts the output of DBR memory bank A in the modified DBR embodiment.
Figure 5D:
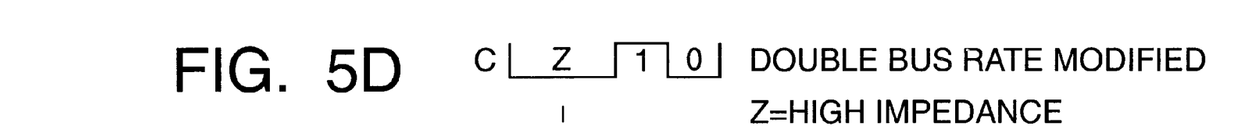
FIG. 5(d) depicts the output of DBR memory bank B in the modified DBR embodiment.
Figure 5E:
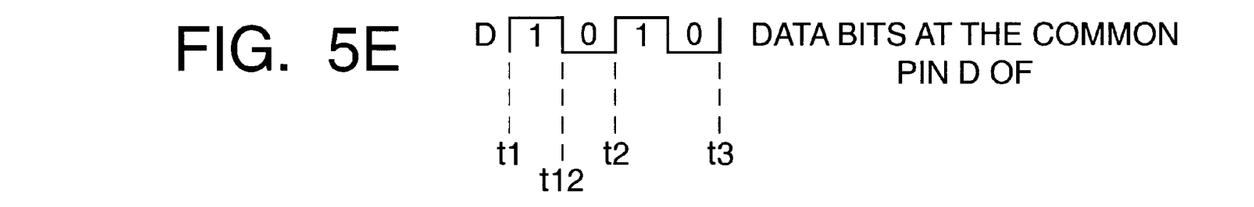
FIG. 5(e) depicts the data bus data stream resulting from the modified DBR embodiment.

In the case that the memory chips are DDR chips, the outputs of both memory chips could be reduced in duration to one quarter of the period and be grouped together to be active either at the first or second half of the period as shown in FIGS. 1(e) and 1(f). This increase in data frequency can be accomplished internally in each SDRAM chip. The connection of the output of the SDRAM with the data bus is either controlled by circuitry internal to the SDRAM, or by an external output enable (OE) control line. When the two DDR devices are connected together as shown in FIG. 4(a), the chips will produce four data bits within one period of the base clock as shown in FIG. 5(e). The base clock itself appears as FIG. 5(a), and has a period p equal to t3–t1.

The SDRAM chip internal arrangement can be such that the four data bits are produced internally instead of using outside controls and connections. The waveform of FIG. 5(b) shows two bits from the output of a DDR chip not modified, the first data bit between t1 and t2, and the second data bit between t2 and t3. The waveform of FIG. 5(c) shows that the two data bits are modified in duration to one quarter of the base clock period, the first data bits occurring between t1 and t12, and the second between t12 and t2. These data bits are valid at the first half of the period only. The waveform of FIG. 5(d) shows that the two DDR modified data bits are valid for the second half of the base clock period, t2:t3. Therefore, when chips are connected as in FIG. 4(a), and both memory chip A 101 and memory chip B 102 are DDR chips, the net result will be to produce 4 data bits in one period of the base clock, as seen in FIG. 4(e). This is true for both input data streams and output data streams.

Internal to each SDRAM memory chip is a controller which contains a data receiver. When data is transmitted into this receiver, it must be synchronized with the basic system clock, as in FIG. 5(a). In order to accomplish the clocking of the data into a receiver of the controller, several methods can be employed. If the data stream of the waveform of FIG. 5(e) is generated by the SDRAMs, a clock of the same waveform can be produced internal to the SDRAMs. This clock can be used by the controller of each SDRAM to latch up the data into its own registers for processing.

There is a filter speed advantage to be had in packaging technique. Ordinarily, in a system containing two memory banks as described herein, the first memory bank will be made up of art array of memory chips which constitute the first bank, while the second memory bank will be made up of an array of memory chips which constitute the second bank However, it is advantageous, in light of the current invention, to enclose within a single substrate the circuitry of two such memory chips, with one being used in the first bank, and the other being used in the second bank, with a single data bus output switched from the outputs of the two chips. Such a configuration provides substantial speed advantages over the prior art, as the distances between the data paths of the first and second memory bank chips are substantially reduced.

EMBODIMENT WITHOUT PHASE DELAYED CLOCK

In a final preferred embodiment, memory banks A and B are both DDR memories. The same basic clock signal is used to synchronize both memory bank A and memory bank B.

At the beginning of each cycle, memory bank A produces a first internal output which is valid for a duration p/4 of the basic clock cycle, and a second internal output at p/2 after the beginning of the cycle, again lasting for a duration p/4. Memory bank B produces a third internal output, beginning at p/4 after the beginning of the cycle. which is valid for a duration p/4 of the basic clock cycle, and a fourth internal output, again at 3p/4 after the beginning of the cycle, again lasting for a duration p/4.

Before outputting these internal outputs onto the data bus, the first and second internal outputs are exchanged, and the third and fourth internal outputs are exchanged. As a result, the data on the data bus will contain the data bits from memory chip A during the first half of the clock period, and from memory chip B during the second half of the clock period.

DESCRIPTION OF CLOCK DELAY GENERATION

There are a number of methods for generating the secondary clock inside the SDRAM devices or any other device that is used according to the present invention.

As was pointed above, the main clock feeding the memory module is phase shifted or delayed by one half period, 180 degrees, or one quarter period, 90 degrees, depending upon the specific embodiment.

Figure 6:
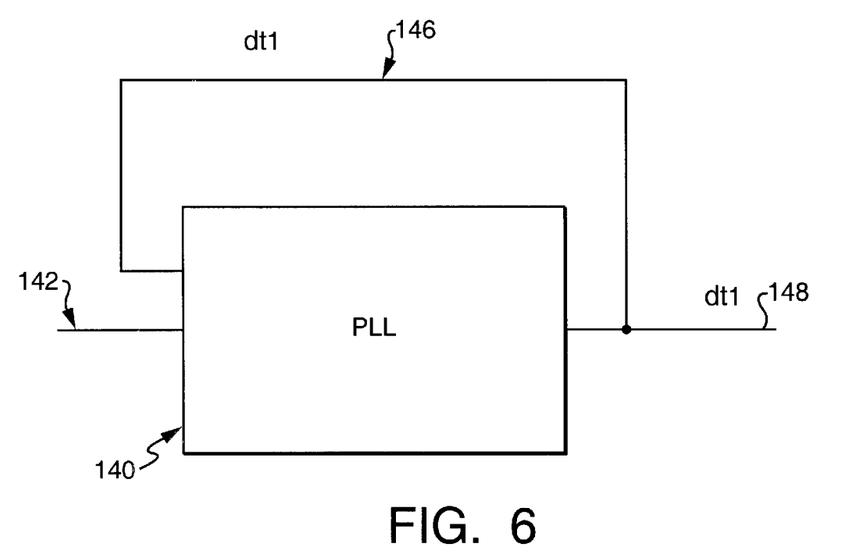
FIG. 6 depicts a phase-locked loop (PLL).

For high-speed operation, one method of generating the delayed clock signal is the use of a clock driver or Phase Locked Loop (PLL) with multiple outputs of the same phase in order to drive several SDRAM chips with small capacitive loading. A simple PLL 140 is shown in FIG. 6.

The PLL has an input 142, and output 148, with a time delay dt1 inherent between the output of the PLL and the load (not shown). A feedback signal 146 has the identical delay dt1. As a result, the output will be phase locked to the signal as seen at the load.

Skewed drivers are defined as those with a single input, and two or more outputs, with each output having a different phase angle, or delay, relative to the input.

Figure 7:
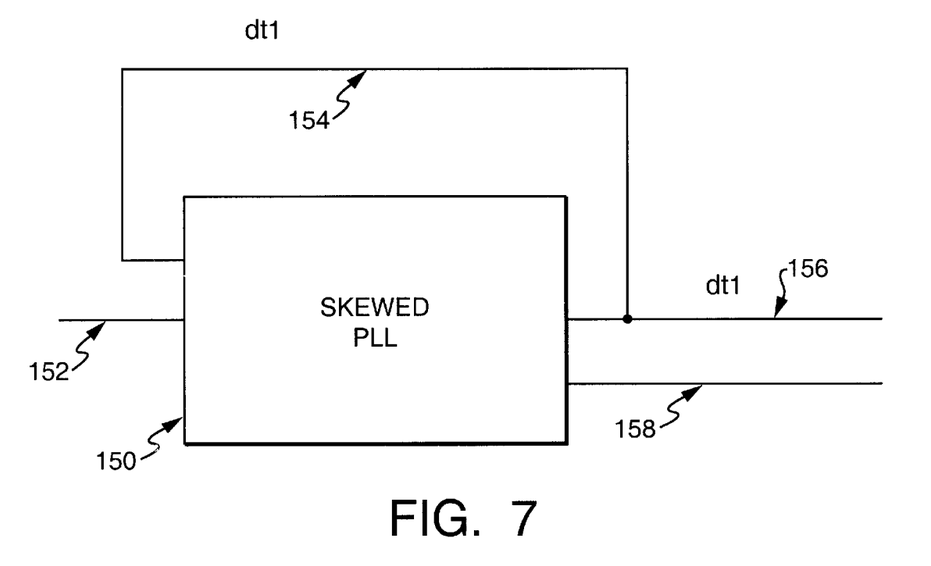
FIG. 7 depicts a skewed PLL.

A variation of the PLL is the skewed PLL, shown in FIG. 7. The skewed PLL has input 152, and two separate outputs 156 and 158. Unlike the variety of the PLL which has multiple outputs of the same phase, the skewed PLL has a phase delay between the outputs 156 and 158, which may be used to drive multiple clocks required by this invention.

Because of the ability to phase synchronize the incoming clock with the PLL outputs, any PLL output can be used to generate the delayed clock or phase shifted clock. In order to generate a delayed clock for driving a second PLL whose outputs are used for driving SDRAM devices of the second bank, two methods are used to produce a phase shifted, or delayed, clock.

The phase shift, or delay of the PLL may be created in a number of ways. The PLL may contain a delay internal to the PLL, so that the output will be automatically delayed relative to the input. Or, alternatively, a delay line or circuit may be inserted in series between two PLL circuits, creating a cascaded PLL delay circuit.

One proposed method is to use the clock generated by the DIMM to drive the first bank of SDRAMs. If the clock delay is done on the DIMM, a printed wire length is incorporated to accurately give the required delay to generate a shifted clock. This shifted clock is then used to drive a second PLL. The output of the second PLL is the delayed clock used to drive the second of the two banks of SDRAMs. The wire length required is determined via simulation, theoretical, and trial and error methods.

If the delayed clock is generated on a motherboard, then the DIMM uses a delayed clock also located on the mother board, to drive the PLL, located on the DIMM. The outputs of the PLL will drive the SDRAM chips of the bank.

Other methods of creating a second phase delayed clock include use of delay line chips can also be used to accomplish the predetermined phase shift required for the delayed clock. Also, combination of passive and active circuits can be employed to accomplish the desired phase shift. These include programmable delay lines currently commercially available. These devices and techniques are well known in the art, and will not be described further herein.

The following is a list of other applications for the techniques described herein. This list is not intended to be complete, nor to exclude this technique from use in other applications:

1. Computer memory sub-systems.
2. Arrangement of individual computer memory chips on a module or motherboard.
3. Arrangement of Flash memory chips on a module or on a motherboard.
4. EEPROM memory chips on a module or motherboard, individual logic chips on a module or on a motherboard.
5. Arrangement of data buses carrying data transmission from same or different sources.
6. Arrangement of microprocessor buses for data and control lines to achieve higher switching speeds.
7. Multiplexing of CPU buses for increased bandwidth without increasing the clock speeds.
8. Multiplexing DSP buses for increased bandwidth without increasing the basic clock rate.
9. Individual memory chips on the silicon level to produce higher data rate without increasing the base clock speed.

It will be apparent that improvements and modifications may be made within the purview of the invention without departing from the scope of the invention defined in the appended claims.

I claim:

1. A computer memory system having a data bus, with a signal on the data bus having a period p1, the system comprising
   (a) a first memory bank having data lines;
   (b) a second memory bank having data lines;
   (c) a first clock signal attached to the first memory bank, and a second clock signal attached to the second memory bank, each clock signal having a period p2, and wherein the second clock signal is delayed by a time ΔT from the first clock signal;
   (d) a first FET switch connecting the data lines of the first memory bank with the data bus beginning at the start of each cycle of the first clock signal, and lasting for a time ΔT1; and
   (e) a second FET switch connecting the data lines of the second memory bank with the data bus beginning at a time ΔT2 after the start of each cycle of the second clock signal, and lasting for a time ΔT3,
   wherein ΔT, ΔT1, ΔT2, and ΔT3 are chosen so that the data lines of the first FET switch and those of the second PET switch are never connected to the data bus concurrently.

2. The computer memory system of claim 1, wherein the data bus period p1 is twice the period of each clock signal p2.

3. The computer memory system of claim 2, wherein the PET switches reside external to the memory banks.

4. The system of claim 3, further comprising a motherboard, and wherein a means to generate the delayed clock signal, the first memory bank, the second memory bank, the first FET switch, and the second FET switch are located on the mother board.

5. The system of claim 3, further comprising one or more DIMM boards, and wherein a means to generate the delayed clock signal, the first memory bank, the second memory bank, the first FET switch, and the second FET switch arm located on the DIMM boards.

6. The system of claim 5, wherein: the first FET switch further comprises a control input, a first side connected with the data bus, and a second side connected to the data lines of the first memory bank; and the second FET switch further comprises a control input, a first side connected with the data bus, and a second side connected to the data lines of the second memory bank.

7. The computer memory system of claim 1, further comprising:
   (a) a third memory bank having data lines;
   (b) a fourth memory bank having data lines;
   (c) a third clock signal attached to the third memory bank, and a fourth clock signal attached to the fourth memory bank, each clock signal having a period p2, and wherein the third clock signal is delayed by a time $\Delta T$ from the second clock signal, and the fourth clock signal is delayed by a time $\Delta T$ from the third clock signal.
   (d) a third FET switch connecting the data lines of the third memory bank with the data bus beginning at the start of each cycle of the third clock signal, and lasting for a time $\Delta T1$; and
   (d) a fourth FET switch connecting the data lines of the fourth memory bank with the data bus beginning at a time $\Delta T2$ after the start of each cycle of the third clock signal, and lasting for a time $\Delta T3$.

8. A computer memory system having a data bus, comprising
   (a) a first DDR memory bank having data lines;
   (b) a second DDR memory bank having data lines;
   (c) a first clock signal attached to the first DDR memory bank, and a second clock signal attached to the second DDR memory bank, each clock signal having a period p2, and wherein the second clock signal is delayed by a time $\Delta T$ from the first clock signal.
   (d) a first FET switch connecting the data lines of the first DDR memory bank with the data bus beginning at the start of each cycle of the first clock signal, and lasting for a time $\Delta T1$; and
   (e) a second FET switch connecting the data lines of the second DDR memory bank with the data bus beginning at a time $\Delta T2$ after the start of each cycle of the second clock signal, and lasting for a time $\Delta T3$, wherein $\Delta T$, $\Delta T1$, $\Delta T2$, and $\Delta T3$ are chosen so that the data lines of the first FET switch and those of the second FET switch are never connected to the data bus concurrently.

9. The computer memory system of claim 8, wherein the data bus period p1 is twice the period of each clock signal p2.

10. The computer memory system of claim 9, wherein the FET switches reside external to the memory banks.

11. The system of claim 9, further comprising a motherboard, and wherein a means to generate the delayed clock signal, the first memory bank, the second memory bank, the first FET switch, and the second FET switch are located on the motherboard.

12. The system of claim 9, further comprising one or more DNM boards, and wherein a means to create the delayed clock signal, the first memory bank, the second memory bank, the first FET switch, and the second FET switch are located on the DIMM boards.

13. The system of claim 1, wherein: the first FET switch further comprises a control input, a first side connected with the data bus, and a second side connected to the data lines of the first memory bank; and the second FET switch further comprises a control input, a first side connected with the data bus, and a second side connected to the data lines of the second memory bank.

* * * * *

UNITED STATES PATENT AND TRADEMARK OFFICE
CERTIFICATE OF CORRECTION

| | | |
|---|---|---|
| PATENT NO. | : 6,446,158 B1 | Page 1 of 1 |
| APPLICATION NO. | : 09/572641 | |
| DATED | : September 3, 2002 | |
| INVENTOR(S) | : Chris Karabatsos | |

It is certified that error appears in the above-identified patent and that said Letters Patent is hereby corrected as shown below:

Claim 1:
Column 10, line 45, replace "PET" with --FET--.

Claim 3:
Column 10, line 51, replace "PET" with --FET--.

Claim 5:
Column 10, line 60, replace "arm" with --are--.

Claim 8:
Column 11, line 31, replace "AT" with --$\Delta$T--.

Signed and Sealed this
First Day of March, 2011

David J. Kappos
*Director of the United States Patent and Trademark Office*